United States Patent
Zhang et al.

(10) Patent No.: US 10,734,613 B2
(45) Date of Patent: Aug. 4, 2020

(54) METHOD FOR MANUFACTURING OLED SUBSTRATE

(71) Applicant: BOE Technology Group Co., Ltd., Beijing (CN)

(72) Inventors: Xing Zhang, Beijing (CN); Wei Li, Beijing (CN); Quanhu Li, Beijing (CN); Xuehuan Feng, Beijing (CN); Jianye Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 96 days.

(21) Appl. No.: 16/014,755

(22) Filed: Jun. 21, 2018

(65) Prior Publication Data
US 2019/0067647 A1    Feb. 28, 2019

(30) Foreign Application Priority Data
Aug. 31, 2017  (CN) .......................... 2017 1 0775220

(51) Int. Cl.
*H01L 51/56*    (2006.01)
*H01L 27/32*    (2006.01)
*H01L 51/50*    (2006.01)
*H01L 51/52*    (2006.01)
*H01L 51/00*    (2006.01)

(52) U.S. Cl.
CPC ............ *H01L 51/56* (2013.01); *H01L 27/322* (2013.01); *H01L 51/0023* (2013.01); *H01L 51/5056* (2013.01); *H01L 51/5072* (2013.01); *H01L 51/5092* (2013.01); *H01L 51/5206* (2013.01); *H01L 51/5221* (2013.01); *H01L 51/5228* (2013.01); *H01L 51/5284* (2013.01)

(58) Field of Classification Search
USPC ........................................... 257/40
See application file for complete search history.

(56) References Cited

U.S. PATENT DOCUMENTS 5,614,728 A * 3/1997 Akiyama ................ H01L 27/12
                                                              257/347
5,620,817 A * 4/1997 Hsu .......................... G03F 1/29
                                                              430/322
(Continued)

FOREIGN PATENT DOCUMENTS

CN    102012590 A    4/2011
CN    102455542 A    5/2012
(Continued)

OTHER PUBLICATIONS

First Office Action, including Search Report, for Chinese Patent Application No. 201710775220.5, dated Aug. 28, 2018, 14 pages.

*Primary Examiner* — Caleb E Henry
(74) *Attorney, Agent, or Firm* — Westman, Champlin & Koehler, P.A.

(57) ABSTRACT

A method for manufacturing an organic light-emitting diode substrate is provided and includes: on a base substrate with a black matrix pattern, forming a conductive layer covering the black matrix pattern and a photoresist pattern that partially stacks on the conductive layer, through one patterning process by taking the black matrix pattern as a mask plate; and removing the photoresist pattern and portions of the conductive layer that stack on the photoresist pattern, thereby forming a patterned conductive layer.

19 Claims, 5 Drawing Sheets

---

S100 — forming a conductive layer on a base substrate with a black matric pattern S101 — forming an auxiliary cathode pattern by patterning the conductive layer with the black matrix pattern taken as a mask plate through one patterning process (56) References Cited

U.S. PATENT DOCUMENTS

| | | | |
|---|---|---|---|
| 5,712,065 A | | 1/1998 | Chiang |
| 5,718,991 A | * | 2/1998 | Lin .......................... G03F 1/50 430/5 |
| 5,869,365 A | * | 2/1999 | Sakura ................ H01L 21/0276 257/E21.029 |
| 6,380,559 B1 | * | 4/2002 | Park .................... G02F 1/13458 257/59 |
| 8,475,979 B2 | | 7/2013 | Lin |
| 10,330,918 B1 | * | 6/2019 | Sakai ..................... G02B 5/003 |
| 2003/0214620 A1 | * | 11/2003 | Kim .................... G02F 1/13394 349/155 |
| 2008/0070332 A1 | * | 3/2008 | Cho .................... G02F 1/13394 438/22 |
| 2008/0122347 A1 | * | 5/2008 | Lee .................... H01L 27/3244 313/504 |
| 2012/0100471 A1 | | 4/2012 | Lin |
| 2018/0101092 A1 | * | 4/2018 | He .......................... G02B 5/20 |

FOREIGN PATENT DOCUMENTS

| | | |
|---|---|---|
| CN | 103838044 A | 6/2014 |
| CN | 104571716 A | 4/2015 |
| CN | 106054443 A | 10/2016 |
| CN | 106293294 A | 1/2017 |
| JP | H08-95024 A | 4/1996 |

\* cited by examiner

METHOD FOR MANUFACTURING OLED SUBSTRATE

CROSS-REFERENCE TO RELATED APPLICATION

This application is based on and claims the priority of the Chinese patent application No. 201710775220.5 filed on Aug. 31, 2017, which is incorporated herein by reference in its entirety.

TECHNICAL FIELD

The present disclosure relates to the field of display technology, and in particular to an OLED substrate, a method for manufacturing the same and a display device.

BACKGROUND

Organic Electro-luminescent display (OLED) devices have been widely used due to their features such as light weight, low power consumption, high response and high resolution.

An OLED display device includes an array substrate and a package substrate for packaging the array substrate. The array substrate includes an anode, a cathode and a luminescent layer between the anode and the cathode. For a top-emitting OLED, when light emitted from a luminescent layer is emitted outside from a cathode side, the thickness of the cathode is thin so that the light can pass through the cathode. Thus, the cathode has the largest resistance in the whole OLED structure.

SUMMARY

According to a first aspect, one embodiment of the present disclosure provides a method for manufacturing an organic light-emitting diode substrate which includes: on a base substrate with a black matrix pattern, forming a conductive layer covering the black matrix pattern and a photoresist pattern through one patterning process by taking the black matrix pattern as a mask plate, wherein the photoresist pattern partially stacks on the conductive layer; and removing the photoresist pattern and portions of the conductive layer that do not cover the black matrix pattern, with portions of the conductive layer that cover the black matrix pattern forming a patterned conductive layer.

Optionally, on a base substrate with a black matrix pattern, forming a conductive layer covering the black matrix pattern and a photoresist pattern through one patterning process by taking the black matrix pattern as a mask plate, wherein the photoresist pattern partially stacks on the conductive layer, includes: forming a negative photoresist layer covering the black matrix pattern on the base substrate; irradiating light to one side of the base substrate away from the black matrix pattern to expose the negative photoresist layer; removing unexposed portions of the negative photoresist layer that are blocked by the black matrix pattern by means of development, thereby forming a negative photoresist pattern; and forming the conductive layer covering the black matrix pattern and the negative photoresist pattern.

Optionally, the removing the photoresist pattern and portions of the conductive layer that do not cover the black matrix pattern, with portions of the conductive layer that cover the black matrix pattern forming a patterned conductive layer, includes: lifting off the negative photoresist pattern and the portions of the conductive layer that stack on the negative photoresist pattern, thereby forming the patterned conductive layer.

Optionally, the forming the conductive layer covering the black matrix pattern and the negative photoresist pattern includes: forming the conductive layer covering the black matrix pattern and the negative photoresist pattern in such a manner that portions of the conductive layer on the negative photoresist pattern are separated from portions of the conductive layer on the black matrix pattern.

Optionally, the forming the conductive layer covering the black matrix pattern and the negative photoresist pattern in such a manner that portions of the conductive layer on the negative photoresist pattern are separated from portions of the conductive layer on the black matrix pattern includes: forming the conductive layer covering the black matrix pattern and the negative photoresist pattern in such a manner that a difference between a thickness of the black matrix pattern and a thickness of the negative photoresist pattern is greater than a thickness of the conductive layer.

Optionally, before the forming a negative photoresist layer covering the black matrix pattern on the base substrate, the method further includes: forming an alignment mark at a non-display region of the base substrate, and forming the black matrix pattern at a display region of the base substrate.

Optionally, the irradiating light to one side of the base substrate away from the black matrix pattern includes: irradiating light to one side of the base substrate away from the black matrix pattern with the light substantially perpendicular to the base substrate.

Optionally, after the removing unexposed portions of the negative photoresist layer that are blocked by the black matrix pattern by means of development, thereby forming a negative photoresist pattern, the negative photoresist pattern and the black matrix pattern are in an identical layer.

Optionally, after the removing unexposed portions of the negative photoresist layer that are blocked by the black matrix pattern by means of development, thereby forming a negative photoresist pattern, the negative photoresist pattern and the black matrix pattern are directly formed on the base substrate in an identical layer.

Optionally, on a base substrate with a black matrix pattern, forming a conductive layer covering the black matrix pattern and a photoresist pattern through one patterning process by taking the black matrix pattern as a mask plate, wherein the photoresist pattern partially stacks on the conductive layer, includes: forming the conductive layer covering the black matrix pattern on the base substrate; forming a positive photoresist layer covering the conductive layer; irradiating light to one side of the base substrate away from the black matrix pattern to expose the positive photoresist layer; removing exposed portions of the positive photoresist layer that are not blocked by the black matrix pattern by means of development, thereby forming a positive photoresist pattern.

Optionally, the removing the photoresist pattern and portions of the conductive layer that do not cover the black matrix pattern, with portions of the conductive layer that cover the black matrix pattern forming a patterned conductive layer includes: etching away the portions of the conductive layer that do not cover the black matrix pattern, and lifting off the positive photoresist pattern, thereby enabling portions of the conductive layer that covers the black matrix pattern to form the patterned conductive layer.

Optionally, the lifting off the positive photoresist pattern includes: lifting off the positive photoresist pattern with a stripping solution.

Optionally, after the removing exposed portions of the positive photoresist layer that are not blocked by the black matrix pattern by means of development, thereby forming a positive photoresist pattern, the positive photoresist pattern covers the black matrix pattern.

Optionally, after the removing exposed portions of the positive photoresist layer that are not blocked by the black matrix pattern by means of development, thereby forming a positive photoresist pattern, the positive photoresist pattern and the black matrix pattern are in different layers.

Optionally, before the forming a positive photoresist layer covering the conductive layer, the method further includes: forming an alignment mark at a non-display region of the base substrate, and forming the black matrix pattern at a display region of the base substrate.

Optionally, irradiating light to one side of the base substrate away from the black matrix pattern includes: irradiating light to one side of the base substrate away from the black matrix pattern with the light substantially perpendicular to the base substrate.

Optionally, after forming a patterned conductive layer, the method further includes: forming color filter patterns in hollow-out regions of the black matrix pattern.

Optionally, the conductive layer is a three-layer laminated structure.

Optionally, the three-layer laminated structure includes a middle layer that is made of Al and Nd alloy, and two lateral layers that are made of Mo.

Optionally, removing the photoresist pattern and portions of the conductive layer that do not cover the black matrix pattern, with portions of the conductive layer that cover the black matrix pattern forming a patterned conductive layer, further includes: removing portions of the conductive layer that are at edges of the black matrix pattern.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise indicated. The implementations set forth in the following description of exemplary embodiments do not represent all implementations consistent with the disclosure. Instead, they are merely examples of devices and methods consistent with aspects related to the disclosure as recited in the appended claims.

In order to reduce resistance of the cathode in the whole OLED structure, an auxiliary cathode pattern is usually fabricated on a black matrix pattern of the package substrate. The auxiliary cathode pattern contacts with the cathode on the array substrate to reduce the resistance.

However, when manufacturing the auxiliary cathode pattern, mask plates are required for performing photo process to pattern the auxiliary cathode pattern, but preparation of the mask plate results in an increase in production costs.

Figure 1:
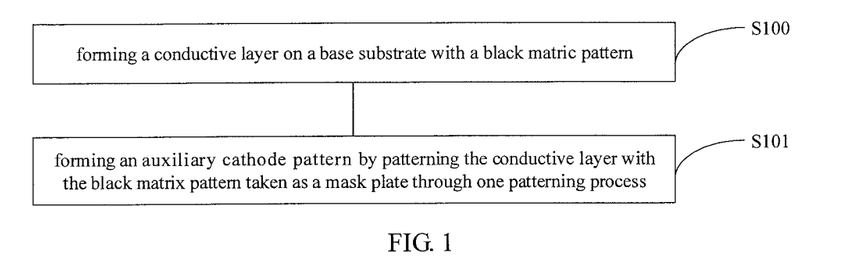
FIG. 1 is a first flowchart of a method for manufacturing an OLED substrate according to an exemplary embodiment of the present disclosure.

In order to solve the above problem, one embodiment of the present disclosure provides a method for manufacturing an OLED substrate. As shown in FIG. 1, the method includes the following steps S100 and S101.

The step S100 is to form a conductive layer on a base substrate with a black matrix pattern.

The material of the conductive layer is limited. The conductive layer may be made of metal such as Ag, Cu, Mg, Al, or their alloy.

Further, the conductive layer may be formed on the base substrate by means of sputter, spinning coating, vacuum evaporation, etc. The conductive layer covers the black matrix pattern.

The step S101 is to form an auxiliary cathode pattern by patterning the conductive layer with the black matrix pattern taken as a mask plate through one patterning process.

Taking the black matrix pattern as the mask plate means that the black matrix pattern is equivalent to one mask plate in the process of patterning the conductive layer.

Here, the patterning process includes coating photoresist, masking, exposing, developing and etching processes.

In the method for manufacturing OLED substrates according to one embodiment of the present disclosure, in the process of forming the auxiliary cathode pattern, the black matrix pattern is taken as one mask plate for patterning the conductive layer, thus no additional mask plate is required, thereby reducing production costs comparing with the related art.

The method for manufacturing OLED substrates will be described in details hereinafter with two examples.

Figure 2:
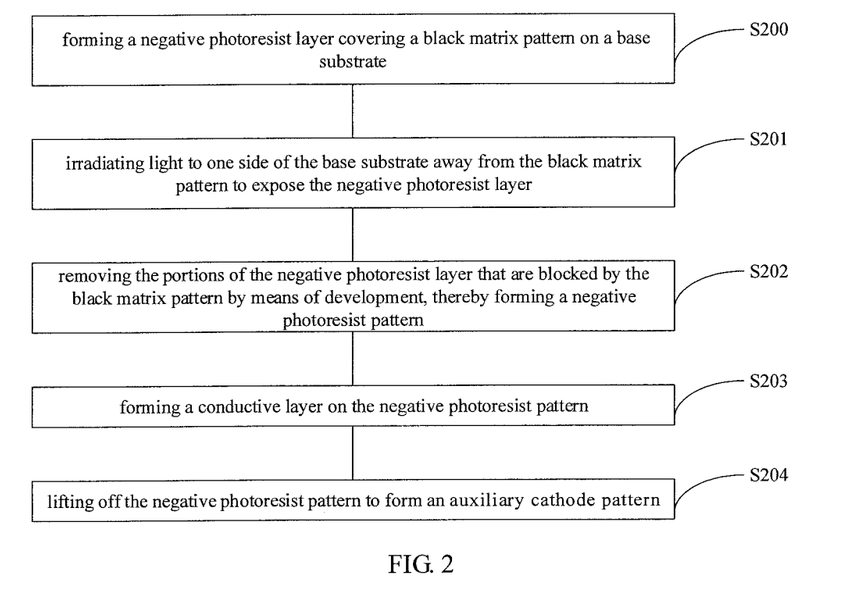
FIG. 2 is a second flowchart of a method for manufacturing an OLED substrate according to an exemplary embodiment of the present disclosure.

As shown in FIG. 2, a method for manufacturing OLED substrates according to an exemplary embodiment of the present disclosure includes the following steps S200 to S204.

Figure 3:
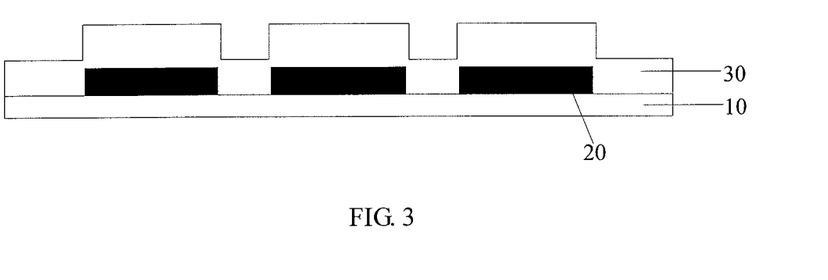
FIG. 3 is a schematic view of forming a negative photoresist layer on a base substrate with a black matrix pattern according to an exemplary embodiment of the present disclosure.

As shown in FIG. 3, the step S200 is to form a negative photoresist layer 30 covering a black matrix pattern 20 on a base substrate 10.

The thickness of the negative photoresist layer 30 is not limited, and may be set according to needs. In one embodiment, the thickness of the negative photoresist layer 30 may be greater than the thickness of the black matrix pattern 20. In other embodiments, the thickness of the negative photoresist layer 30 may be less or equal to the thickness of the black matrix pattern 20.

Here, the negative photoresist refers to materials that form an insoluble matter after light irradiation. The materials of the negative photoresist are not specifically limited, as long as they can form an insoluble matter after light irradiation. Generally, the negative photoresist may be composed of photosensitive resin, sensitizer and solvent.

Figure 4:
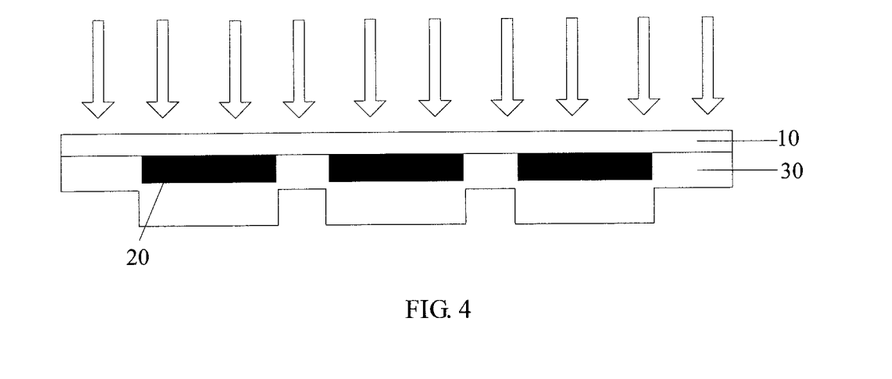
FIG. 4 is a schematic view of exposing the negative photoresist layer according to an exemplary embodiment of the present disclosure.

As shown in FIG. 4, the step S201 is to irradiate light to one side of the base substrate 10 away from the black matrix pattern 20 to expose the negative photoresist layer 30.

In one embodiment, in the process of exposing the negative photoresist layer 30, a light source is used. The light source includes but not limited to a white light source or an ultraviolet light source. In addition, the light source may be a bar-shaped light source, a planar light source or a light source having other shapes, as long as the negative photoresist layer 30 is subjected to the same light intensity.

On the above basis, time length and exposure intensity of the exposing process may be set according to the type of the negative photoresist and the thickness of the negative photoresist layer 30.

Here, when exposing the negative photoresist layer 30, portions of the negative photoresist layer 30 that are blocked by the black matrix pattern 20 cannot be irradiated by light, and portions of the negative photoresist layer 30 that are not blocked by the black matrix pattern 20 can be irradiated by light.

Figure 5A:
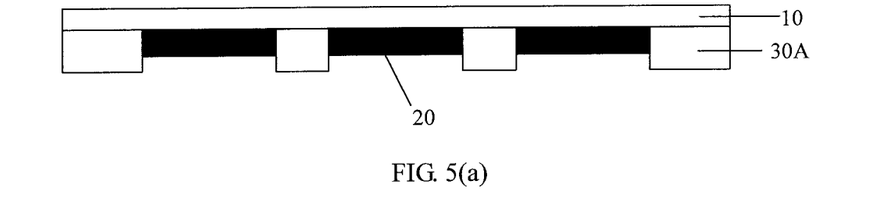
FIG. 5(a) is a first schematic view of forming a negative photoresist layer on a base substrate according to an exemplary embodiment of the present disclosure.
Figure 5B:
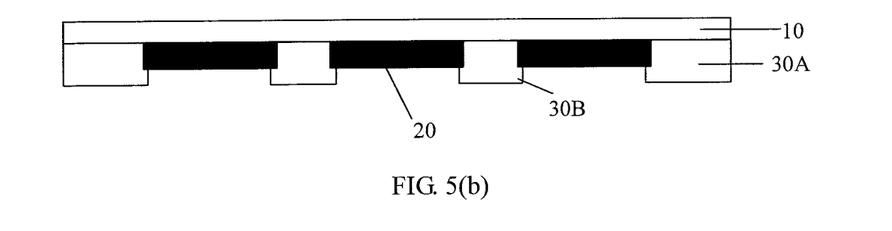
FIG. 5(b) is a second schematic view of forming a negative photoresist layer on a base substrate according to an exemplary embodiment of the present disclosure.

As shown in FIG. 5(a) and FIG. 5(b), the step S202 is to remove the portions of the negative photoresist layer 30 that are blocked by the black matrix pattern 20 by means of development, thereby forming a negative photoresist pattern 30A.

Here, the base substrate 10 after exposing treatment is immersed into in a developing liquid for development. Then, the portions of the negative photoresist layer 30 that are blocked by the black matrix pattern 20 are not irradiated by light and are removed by means of development; and the portions of the negative photoresist layer 30 that are not blocked by the black matrix pattern 20 are irradiated by light and remain after the development treatment, thereby forming the negative photoresist pattern 30A.

It should be noted that, in an ideal state, as shown in FIG. 5(a), after exposing and developing treatments, the portions of the negative photoresist layer 30 that are blocked by the black matrix pattern 20 can be removed completely. However, in an actual preparation process, as shown in FIG. 5(b), some of the negative photoresist layer at edges of the black matrix pattern 20 may be not removed and then form a residual negative photoresist portion 30B.

Figure 6:
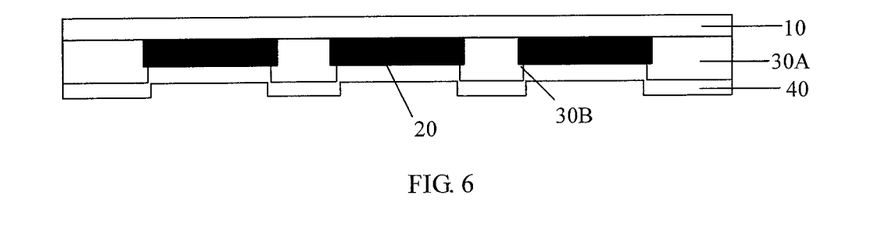
FIG. 6 is a first schematic view of forming a conductive layer on a base substrate according to an exemplary embodiment of the present disclosure.

As shown in FIG. 6, the step S203 is to form a conductive layer 40 on the negative photoresist pattern 30A.

The conductive layer 40 covers the negative photoresist pattern 30A and the black matrix pattern 20.

Figure 7:
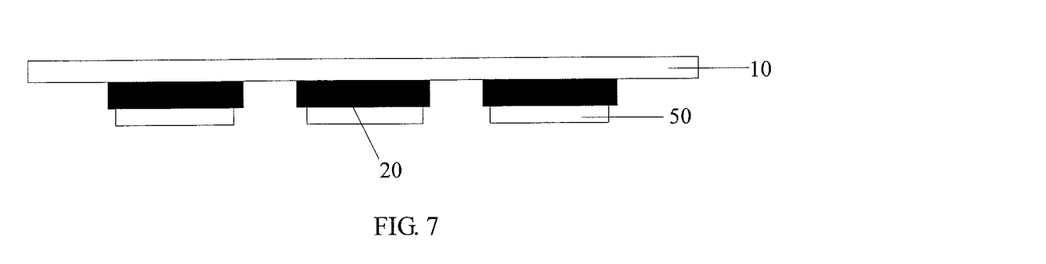
FIG. 7 is a schematic view of forming an auxiliary cathode pattern on the base substrate according to an exemplary embodiment of the present disclosure.

As shown in FIG. 7, the step S204 is to lift off the negative photoresist pattern 30A to form an auxiliary cathode pattern 50.

How to lift off the negative photoresist pattern 30A is not limited. For example, the negative photoresist pattern 30A may be lifted off by means of a stripping solution.

Here, when lifting off the negative photoresist pattern 30A, the conductive layer 40 on the negative photoresist pattern 30A is also lifted off. Since the negative photoresist pattern 30A is not on the black matrix pattern 20, the conductive layer 40 on the black matrix pattern 20 will not be lifted off, thereby forming the auxiliary cathode pattern 50 on the black matrix pattern 20. In addition, when light is irradiated to the base substrate 10 in a direction perpendicular to the base substrate 10, in an ideal state, the size of the auxiliary cathode pattern 50 is exactly the same as the size of the black matrix pattern 20. However, an actual preparation process, as shown in FIG. 7, the size of the auxiliary cathode pattern 50 is less than the size of the black matrix pattern 20.

It should be noted that, when the conductive layer 40 is formed on the negative photoresist pattern 30A, the conductive layer 40 on the negative photoresist pattern 30A and the conductive layer 40 on the black matrix pattern 20 are connected together. Since a cohesive force between the conductive layer 40 and the black matrix pattern 20 is greater than that between the conductive layer 40 and the negative photoresist pattern 30A as well as the conductive layer 40 is thin, when lifting off the negative photoresist pattern 30A, it is easy to break the conductive layer 40 on the negative photoresist pattern 30A from the conductive layer 40 on the black matrix pattern 20, and then the conductive layer 40 on the black matrix pattern 20 is remained and forms the auxiliary cathode pattern 50.

According to the above method for manufacturing OLED substrates, light is irradiated to one side of the base substrate 10 away from the black matrix pattern 20. Since the portions of the negative photoresist layer 30 that are blocked by the black matrix pattern 20 are not exposed to the light and the portions of the negative photoresist layer 30 that are not blocked by the black matrix pattern 20 are exposed to the light, the portions of the negative photoresist layer 30 that are not exposed to the light are removed away by means of the development treatment. After the conductive layer 40 is formed on the negative photoresist pattern 30A, the conductive layer 40 on the negative photoresist pattern 30A is lifted off when lifting off the negative photoresist pattern 30A. Further, when lifting off the negative photoresist pattern 30A, the conductive layer 40 on the black matrix pattern 20 is reserved to form the auxiliary cathode pattern 50 because the negative photoresist pattern 30A is not on the black matrix pattern 20. Comparing with the related art, in the process of manufacturing the auxiliary cathode pattern

50, no mask plate is required and the etch process is omitted, thereby reducing the production costs. In addition, in this embodiment, the patterning process for manufacturing the auxiliary cathode pattern 50 does not include the etch process. In other embodiment, the patterning process may not include all of coating photoresist, masking, exposing, developing and etching processes.

Figure 8:
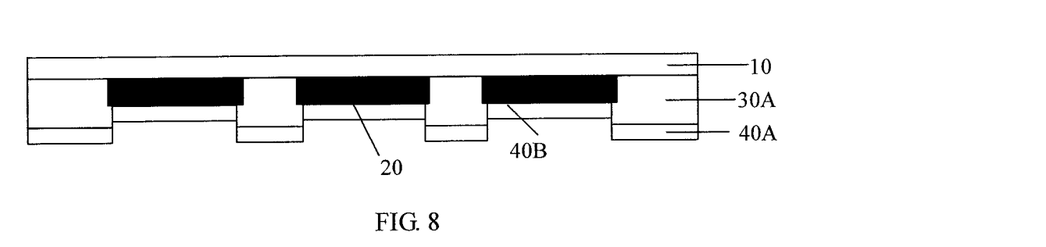
FIG. 8 is a second schematic view of forming a conductive layer on a base substrate according to an exemplary embodiment of the present disclosure.

Optionally, the step S203 specifically includes: as shown in FIG. 8, forming a conductive layer 40A on the negative photoresist pattern 30A and forming a conductive layer 40B on the black matrix pattern 20 in such a manner that the conductive layer 40A on the negative photoresist pattern 30A is disconnected from the conductive layer 40B on the black matrix pattern 20.

Here, when forming the conductive layer 40A on the negative photoresist pattern 30A and forming the conductive layer 40B on the black matrix pattern 20, how to enable the conductive layer 40A on the negative photoresist pattern 30A to be disconnected from the conductive layer 40B on the black matrix pattern 20 is not limited. For example, a thickness difference between the thickness of the black matrix pattern 20 and the thickness of the negative photoresist pattern 30A may be increased to enable the conductive layer 40A on the negative photoresist pattern 30A is disconnected from the conductive layer 40B on the black matrix pattern 20.

In one embodiment, since the conductive layer 40A on the negative photoresist pattern 30A is disconnected from the conductive layer 40B on the black matrix pattern 20 when the conductive layer 40A and the conductive layer 40B are formed, only the conductive layer 40A on the negative photoresist pattern 30A is lifted off when lifting off the negative photoresist pattern 30A, and the conductive layer 40A on the negative photoresist pattern 30A can be easily lifted off. The conductive layer 40B on the black matrix pattern 20 is reserved at the black matrix pattern 20.

Figure 9:
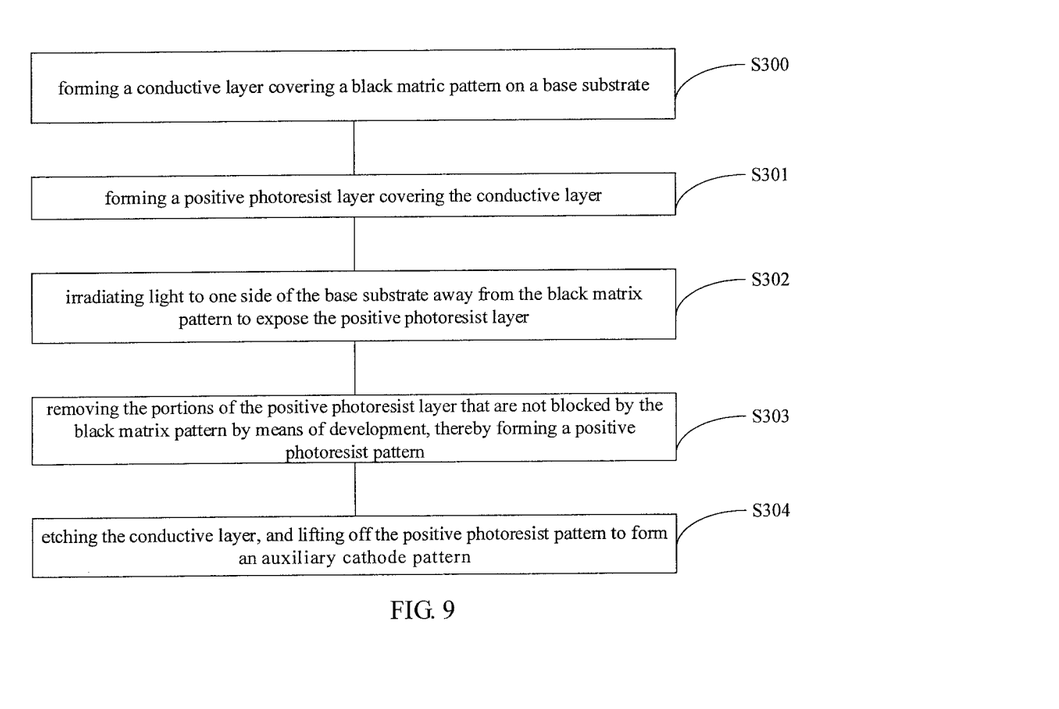
FIG. 9 is a third flowchart of a method for manufacturing an OLED substrate according to an exemplary embodiment of the present disclosure.

As shown in FIG. 9, another method for manufacturing an OLED substrate is provided in one embodiment of the present disclosure and includes the following steps S300 and S304.

Figure 10:
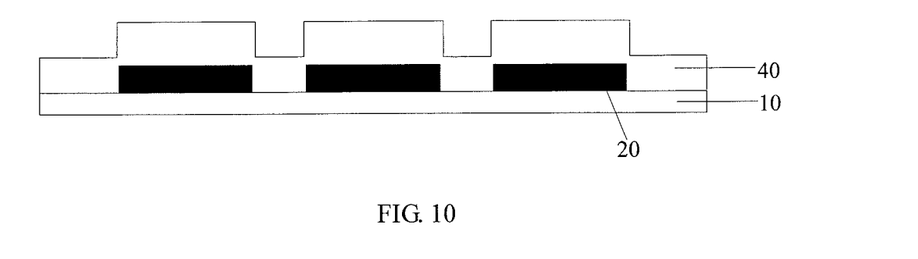
FIG. 10 is a schematic view of forming a conductive layer on a base substrate with a black matrix pattern according to an exemplary embodiment of the present disclosure.

As shown in FIG. 10, the step S300 is to form a conductive layer 40 covering a black matrix pattern 20 on a base substrate 10.

Figure 11:
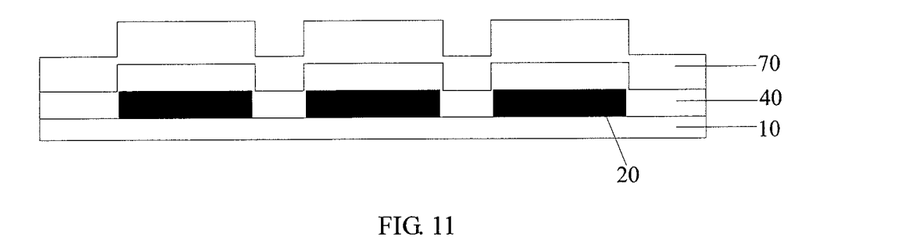
FIG. 11 is a schematic view of forming a positive photoresist layer on the conductive layer according to an exemplary embodiment of the present disclosure.

As shown in FIG. 11, the step S301 is to form a positive photoresist layer 70 covering the conductive layer 40.

The positive photoresist refers to materials that form an insoluble matter after light irradiation. The materials of the positive photoresist are not specifically limited, as long as they can form an insoluble matter after light irradiation. Generally, the positive photoresist may be composed of photosensitive resin, sensitizer and solvent.

Figure 12:
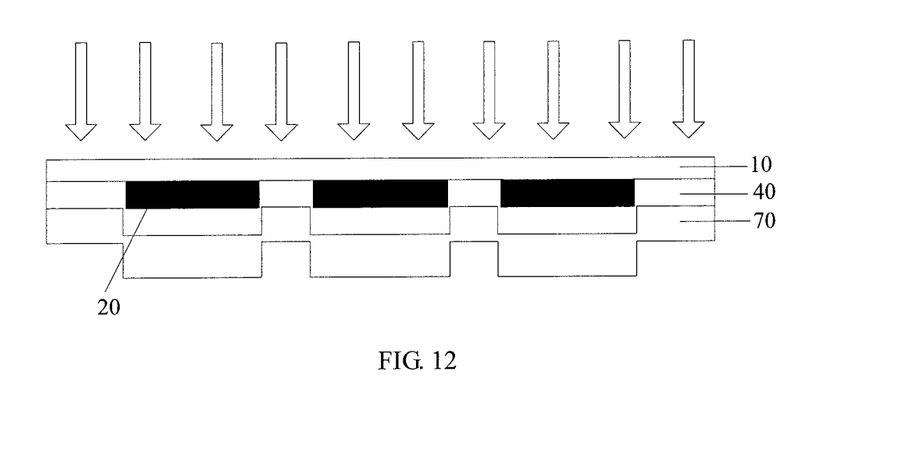
FIG. 12 is a schematic view of exposing the positive photoresist layer according to an exemplary embodiment of the present disclosure.

As shown in FIG. 12, the step S302 is to irradiate light to one side of the base substrate 10 away from the black matrix pattern 20 to expose the positive photoresist layer 70.

Time length and exposure intensity of the exposing process may be set according to the type of the positive photoresist and the thickness of the positive photoresist layer 70 on the base substrate 10.

Here, when exposing the positive photoresist layer 70, portions of the positive photoresist layer 70 that are blocked by the black matrix pattern 20 cannot be irradiated by light, and portions of the positive photoresist layer 70 that are not blocked by the black matrix pattern 20 can be irradiated by light.

Figure 13:
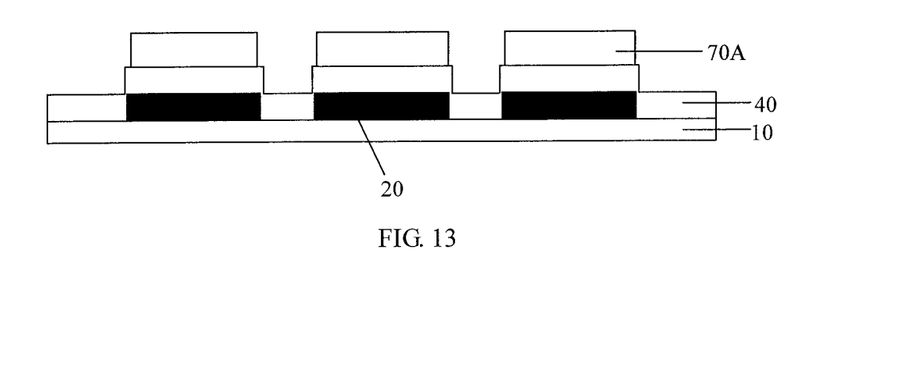
FIG. 13 is a schematic view of forming a positive photoresist pattern on the base substrate according to an exemplary embodiment of the present disclosure.

As shown in FIG. 13, the step S303 is to remove the portions of the positive photoresist layer 70 that are not blocked by the black matrix pattern 20 by means of development, thereby forming a positive photoresist pattern 70A.

Here, the base substrate 10 after exposing treatment is immersed into in a developing liquid for development. Then, the portions of the positive photoresist layer 70 that are blocked by the black matrix pattern 20 are reserved; and the portions of the positive photoresist layer 70 that are not blocked by the black matrix pattern 20 are irradiated by light and removed after the development treatment, thereby forming the positive photoresist pattern 70A.

It should be noted that, when light is irradiated to the base substrate 10 in a direction perpendicular to the base substrate 10, in an ideal state, after exposing and developing treatments are performed to the positive photoresist layer 70, the size of the positive photoresist pattern 70A is the same as the size of the black matrix pattern 20. However, an actual preparation process, there may be a slight difference between the size of the positive photoresist pattern 70A and the size of the black matrix pattern 20 due to factors such as irradiation angles and light dispersity. For example, the size of the positive photoresist pattern 70A is less than the size of the black matrix pattern 20.

Figure 14:
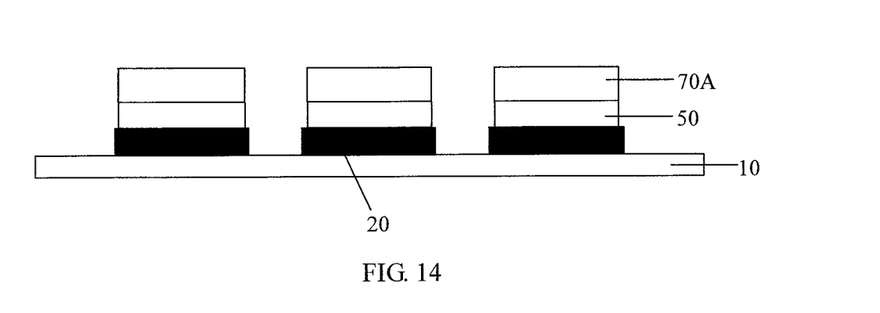
FIG. 14 is a schematic view of forming a positive photoresist pattern and an auxiliary cathode pattern on the base substrate according to an exemplary embodiment of the present disclosure.

As shown in FIG. 14, the step S304 is to etch the conductive layer 40, and lift off the positive photoresist pattern 70A to form an auxiliary cathode pattern 50, as shown in FIG. 7.

When etching the conductive layer 40, portions of the conductive layer 40 that are blocked by the positive photoresist layer 70 cannot be etched, and portions of the conductive layer 40 that are not blocked by the positive photoresist layer 70 are etched away. In this way, after the positive photoresist pattern 70A is lifted off, only portions of the conductive layer 40 on the black matrix pattern 20 is reserved to form the auxiliary cathode pattern 50.

Here, how to lift off the positive photoresist pattern 70A is not limited. For example, the positive photoresist pattern 70A may be lifted off by means of a stripping solution.

According to the above method for manufacturing OLED substrates, light is irradiated to one side of the base substrate 10 away from the black matrix pattern 20. The black matrix pattern 20 is equivalent to a mask plate, the portions of the positive photoresist layer 70 that are blocked by the black matrix pattern 20 are not exposed to the light and are reserved after the development treatment, and the portions of the positive photoresist layer 70 that are not blocked by the black matrix pattern 20 are exposed to the light and are removed after the development treatment. Thus, when etching the conductive layer 40, the portions of the conductive layer 40 that are not blocked by the positive photoresist layer 70 are etched away, and the portions of the conductive layer 40 that are blocked by the positive photoresist pattern 70A are reserved to form the auxiliary cathode pattern 50. In the process of manufacturing the auxiliary cathode pattern 50, since the black matrix pattern 20 is equivalent to a mask plate, one mask plate is omitted comparing with the related art, thereby reducing the production costs.

Figure 15:
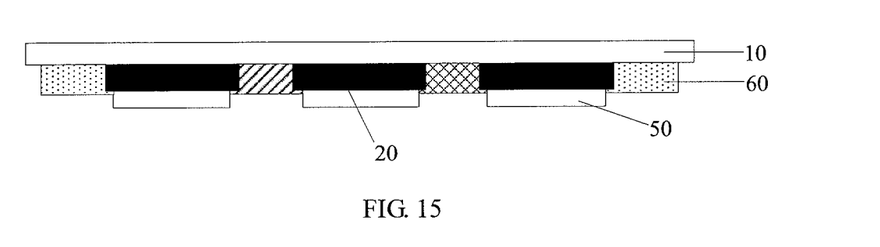
FIG. 15 is a schematic view of forming a color filtering pattern on the base substrate according to an exemplary embodiment of the present disclosure.

Optionally, as shown in FIG. 15, after the auxiliary cathode pattern 50 is formed, the above method further includes: forming color filter patterns 60 in hollow-out regions (i.e., openings) of the black matrix pattern 20.

The color filter patterns 60 may include red color filter patterns, blue color filter patterns or green color filter patterns.

Here, forming color filter patterns 60 in hollow-out regions of the black matrix pattern 20 may include: forming a color filter film, and then forming the color filter patterns 60 by means of exposing, developing and etching processes.

It should be noted that, if the color filter patterns 60 are formed prior to formation of the auxiliary cathode pattern 50, the color filter patterns 60 will block light, which would adversely affect exposure of the negative photoresist. Thus, in one embodiment of the present disclosure, the color filter patterns 60 are formed after formation of the auxiliary cathode pattern 50.

In this embodiment, the color filter patterns 60 are formed on the OLED substrate, thereby achieving color display.

In one embodiment, optionally, the conductive layer 40 may be a three-layer laminated structure.

Material of each layer of the three-layer laminated structure of the conductive layer 40 is not limited, as long as the three-layer laminated structure has a low resistance. Optionally, materials at two lateral layers of the three-layer laminated structure are not easy to oxidize.

Further, optionally, a middle layer of the three-layer laminated structure of the conductive layer 40 may be made of Al and Nd alloy; and two lateral layers of the three-layer laminated structure are made of Mo.

Since each of Al and Nd has a low resistance but is easy to oxidize, as well as Mo is not easy to oxidize, the three-layer laminated structure is not easy to oxidize and has a low resistance when the two lateral layers of the three-layer laminated structure are made of Mo and the middle layer of the three-layer laminated structure is made of Al and Nd alloy.

Figure 16:
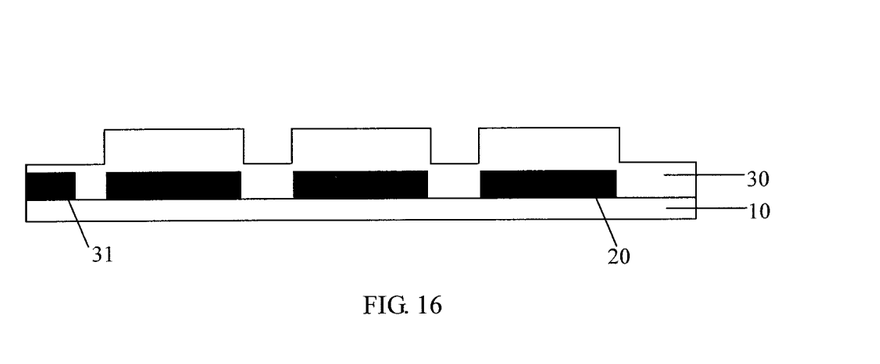
FIG. 16 is a schematic view of alignment marks formed at a non-display region of the base substrate according to an exemplary embodiment of the present disclosure.

Optionally, before forming the negative photoresist layer 30 covering the black matrix pattern 20 on the base substrate 10, the above method further includes: forming an alignment mark 31 (as shown in FIG. 16) at a non-display region of the base substrate 10, and forming the black matrix pattern 20 at a display region of the base substrate 10.

The alignment mark may formed prior to or after formation of the black matrix pattern 20. Of course, the alignment mark and black matrix pattern 20 may be formed simultaneously, at this point, the alignment mark and black matrix pattern 20 may be made of the same material. Here, when the alignment mark and black matrix pattern 20 may be formed simultaneously, the manufacturing process of the array substrate can be simplified. In one embodiment, when the alignment mark is formed prior to formation of the black matrix pattern 20, the alignment mark may be used for alignment in the mask exposing process of forming the black matrix pattern 20.

Here, the alignment mark at the OLED substrate may be used for alignment in the subsequent mask exposing processes of forming the color filter patterns 60, the black matrix pattern 20 or other film layers.

In this embodiment, the presence of the alignment mark at the OLED substrate facilitates alignment in the subsequent mask exposing processes of forming the color filter patterns 60, the black matrix pattern 20 or other film layers, thereby ensuring accuracy of positions of the formed color filter patterns 60, the black matrix pattern 20 or other film layers.

Optionally, as shown in FIG. 4 and FIG. 12, irradiating light to one side of the base substrate 10 away from the black matrix pattern 20 includes: irradiating light to one side of the base substrate 10 away from the black matrix pattern 20 with the light perpendicular to the base substrate 10.

Here, the light perpendicular to the base substrate 10 means that a transmission direction of the light is perpendicular to the base substrate 10.

In one embodiment, when the light is irradiated to the base substrate 10 in a direction perpendicular to the base substrate 10, the portions of the negative photoresist layer 30 that are blocked by the black matrix pattern 20 cannot be irradiated by light, and the portions of the negative photoresist layer 30 on the black matrix pattern 20 can be completely removed away after the development treatment. Thus, when the conductive layer 40 is formed on the negative photoresist layer 30 and then the negative photoresist layer 30 is lifted off, the size of the formed auxiliary cathode pattern 50 is theoretically the same as the size of the black matrix pattern 20, thereby enabling the formed auxiliary cathode pattern 50 to have the largest size.

One embodiment of the present disclosure provides an OLED substrate. As shown in FIG. 7, the OLED substrate includes a base substrate 10, a black matrix pattern 20 on the base substrate 10, and an auxiliary cathode pattern 50 on the black matrix pattern 20. The auxiliary cathode pattern 50 may be obtained through the above method.

In one embodiment, when the auxiliary cathode pattern 50 is manufactured according to the method which includes: forming a negative photoresist layer 30 covering a black matrix pattern 20 on a base substrate 10; irradiating light to one side of the base substrate 10 away from the black matrix pattern 20 to expose the negative photoresist layer 30; removing the portions of the negative photoresist layer 30 that are blocked by the black matrix pattern 20 by means of development, thereby forming a negative photoresist pattern 30A; forming a conductive layer 40 on the negative photoresist pattern 30A; lifting off the negative photoresist pattern 30A to form an auxiliary cathode pattern 50, in the process of manufacturing the auxiliary cathode pattern 50, no mask plate is required and the etch process is omitted, thereby reducing the production costs.

In one embodiment, when the auxiliary cathode pattern 50 is manufactured according to the method which includes: forming a conductive layer 40 covering a black matrix pattern 20 on a base substrate 10; forming a positive photoresist layer 70 covering the conductive layer 40; irradiating light to one side of the base substrate 10 away from the black matrix pattern 20 to expose the positive photoresist layer 70; removing the portions of the positive photoresist layer 70 that are not blocked by the black matrix pattern 20 by means of development, thereby forming a positive photoresist pattern 70A; etching the conductive layer 40, and lifting off the positive photoresist pattern 70A to form an auxiliary cathode pattern 50, in the process of manufacturing the auxiliary cathode pattern 50, no mask plate is required, thereby reducing the production costs.

One embodiment of the present disclosure further provides a display device which includes an OLED substrate and an array substrate. The OLED substrate and the array substrate together define a cell. The OLED substrate may be the above OLED substrate.

Here, the array substrate includes an anode, a cathode and a luminescent layer between the anode and the cathode. The luminescent layer includes at least one of a light emitting layer, a hole transfer layer, a hole injection layer, an electron transfer layer and an electron injection layer.

The display device provided in one embodiment of the present disclosure may be any device that displays an image regardless of motion (for example, video)) or fixed (for example, static image) and whether it is a text or a picture. More specifically, it is contemplated that the embodiments may be implemented in or associated with a variety of electronic devices such as, but not limited to, mobile phones, wireless devices, personal data assistants (PDAs), hand-held or portable computer, GPS receiver/navigator, camera, MP4 video player, camera, game console, watch, clock, calculator, TV monitor, flat panel display, computer monitor, car display (i.e., odometer displays, etc.), navigators, cockpit controllers and/or monitors, displays of camera views (i.e., rear view camera displays in vehicles), electronic photographs, electronic billboards or signs, projectors, building structures, packaging and an esthetic structure (for example, a display for an image of a piece of jewelry), etc. In addition, the display device may also be a display panel.

According to the display device of one embodiment of the present disclosure, since no mask plate is required in the process of manufacturing the auxiliary cathode pattern 50 of the OLED substrate, thereby reducing the production costs of the display device.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. A method for manufacturing an organic light-emitting diode substrate, comprising:
    on a base substrate with a black matrix pattern, forming a conductive layer covering the black matrix pattern and a photoresist pattern through one patterning process by taking the black matrix pattern as a mask plate, wherein the photoresist pattern partially stacks on the conductive layer; and
    removing the photoresist pattern and portions of the conductive layer that do not cover the black matrix pattern, with portions of the conductive layer that cover the black matrix pattern forming a patterned conductive layer;
    wherein on a base substrate with a black matrix pattern, forming a conductive layer covering the black matrix pattern and a photoresist pattern through one patterning process by taking the black matrix pattern as a mask plate, wherein the photoresist pattern partially stacks on the conductive layer, includes:
    forming a negative photoresist layer covering the black matrix pattern on the base substrate;
    irradiating light to one side of the base substrate away from the black matrix pattern to expose the negative photoresist layer;
    removing unexposed portions of the negative photoresist layer that are blocked by the black matrix pattern by means of development, thereby forming a negative photoresist pattern; and
    forming the conductive layer covering the black matrix pattern and the negative photoresist pattern.

2. The method of claim 1, wherein the removing the photoresist pattern and portions of the conductive layer that do not cover the black matrix pattern, with portions of the conductive layer that cover the black matrix pattern forming a patterned conductive layer, includes:
    lifting off the negative photoresist pattern and the portions of the conductive layer that stack on the negative photoresist pattern, thereby forming the patterned conductive layer.

3. The method of claim 1, wherein the forming the conductive layer covering the black matrix pattern and the negative photoresist pattern includes:
    forming the conductive layer covering the black matrix pattern and the negative photoresist pattern in such a manner that portions of the conductive layer on the negative photoresist pattern are separated from portions of the conductive layer on the black matrix pattern.

4. The method of claim 3, wherein the forming the conductive layer covering the black matrix pattern and the negative photoresist pattern in such a manner that portions of the conductive layer on the negative photoresist pattern are separated from portions of the conductive layer on the black matrix pattern includes:
    forming the conductive layer covering the black matrix pattern and the negative photoresist pattern in such a manner that a difference between a thickness of the black matrix pattern and a thickness of the negative photoresist pattern is greater than a thickness of the conductive layer.

5. The method of claim 1, wherein before the forming a negative photoresist layer covering the black matrix pattern on the base substrate, the method further includes:
    forming an alignment mark at a non-display region of the base substrate, and forming the black matrix pattern at a display region of the base substrate.

6. The method of claim 1, wherein the irradiating light to one side of the base substrate away from the black matrix pattern includes:
    irradiating light to one side of the base substrate away from the black matrix pattern with the light substantially perpendicular to the base substrate.

7. The method of claim 6, wherein the lifting off the positive photoresist pattern includes: lifting off the positive photoresist pattern with a stripping solution.

8. The method of claim 1, wherein after the removing unexposed portions of the negative photoresist layer that are blocked by the black matrix pattern by means of development, thereby forming a negative photoresist pattern, the negative photoresist pattern and the black matrix pattern are in an identical layer.

9. The method of claim 1, wherein after the removing unexposed portions of the negative photoresist layer that are blocked by the black matrix pattern by means of development, thereby forming a negative photoresist pattern, the negative photoresist pattern and the black matrix pattern are directly formed on the base substrate in an identical layer.

10. The method of claim 1, wherein on a base substrate with a black matrix pattern, forming a conductive layer covering the black matrix pattern and a photoresist pattern through one patterning process by taking the black matrix pattern as a mask plate, wherein the photoresist pattern partially stacks on the conductive layer, includes:
    forming the conductive layer covering the black matrix pattern on the base substrate;
    forming a positive photoresist layer covering the conductive layer;
    irradiating light to one side of the base substrate away from the black matrix pattern to expose the positive photoresist layer;
    removing exposed portions of the positive photoresist layer that are not blocked by the black matrix pattern by means of development, thereby forming a positive photoresist pattern.

11. The method of claim 10, wherein the removing the photoresist pattern and portions of the conductive layer that do not cover the black matrix pattern, with portions of the conductive layer that cover the black matrix pattern forming a patterned conductive layer, includes:
    etching away the portions of the conductive layer that do not cover the black matrix pattern, and lifting off the positive photoresist pattern, thereby enabling portions of the conductive layer that covers the black matrix pattern to form the patterned conductive layer.

12. The method of claim 10, wherein after the removing exposed portions of the positive photoresist layer that are not blocked by the black matrix pattern by means of development, thereby forming a positive photoresist pattern, the positive photoresist pattern covers the black matrix pattern.

13. The method of claim 12, wherein after the removing exposed portions of the positive photoresist layer that are not blocked by the black matrix pattern by means of development, thereby forming a positive photoresist pattern, the positive photoresist pattern and the black matrix pattern are in different layers.

14. The method of claim 10, wherein before the forming a positive photoresist layer covering the conductive layer, the method further includes:

forming an alignment mark at a non-display region of the base substrate, and forming the black matrix pattern at a display region of the base substrate.

15. The method of claim 10, wherein irradiating light to one side of the base substrate away from the black matrix pattern includes:

irradiating light to one side of the base substrate away from the black matrix pattern with the light substantially perpendicular to the base substrate.

16. The method of claim 1, wherein after forming a patterned conductive layer, the method further includes:

forming color filter patterns in hollow-out regions of the black matrix pattern.

17. The method of claim 1, wherein the conductive layer is a three-layer laminated structure.

18. The method of claim 17, wherein the three-layer laminated structure includes a middle layer that is made of Al and Nd alloy, and two lateral layers that are made of Mo.

19. The method of claim 1, wherein removing the photoresist pattern and portions of the conductive layer that do not cover the black matrix pattern, with portions of the conductive layer that cover the black matrix pattern forming a patterned conductive layer further includes:

removing portions of the conductive layer that are at edges of the black matrix pattern.

* * * * *